United States Patent
Chang et al.

(10) Patent No.: US 9,350,241 B2
(45) Date of Patent: May 24, 2016

(54) BUCK CONVERTER AND CONTROL METHOD THEREFOR

(71) Applicant: ANPEC ELECTRONICS CORPORATION, Hsinchu (TW)

(72) Inventors: Hsiang-Chung Chang, Hsinchu County (TW); Dong-Yi Liu, Miaoli County (TW); Yu-Yu Chen, Yunlin County (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 91 days.

(21) Appl. No.: 14/254,927

(22) Filed: Apr. 17, 2014

(65) Prior Publication Data

US 2015/0188425 A1 Jul. 2, 2015

(30) Foreign Application Priority Data

Dec. 27, 2013 (TW) .............................. 102148816 A

(51) Int. Cl.
| | | |
|---|---|---|
| G05F 1/656 | (2006.01) | |
| H02M 3/158 | (2006.01) | |
| H03K 17/06 | (2006.01) | |
| H02M 1/00 | (2006.01) | |

(52) U.S. Cl.
CPC ............ *H02M 3/158* (2013.01); *H02M 3/1588* (2013.01); *H03K 17/063* (2013.01); *H02M 2001/0032* (2013.01); *Y02B 70/1466* (2013.01); *Y02B 70/16* (2013.01)

(58) Field of Classification Search
CPC ..... H02M 1/38; H02M 7/538; H02M 3/1588; H03K 17/063; G05F 1/618
USPC ......... 323/222, 225, 235, 271–273, 282–288, 323/311; 363/16–20, 21.02, 21.09, 49, 60, 363/65, 89, 127; 327/108, 118, 390, 434, 327/536–540
See application file for complete search history.

(56) References Cited

U.S. PATENT DOCUMENTS

| | | | | |
|---|---|---|---|---|
| 5,126,651 A | * | 6/1992 | Gauen | H02M 3/158 323/222 |
| 5,408,150 A | * | 4/1995 | Wilcox | H02M 1/38 326/104 |
| 5,627,460 A | * | 5/1997 | Bazinet | G05F 1/618 323/224 |
| 8,749,222 B2 | * | 6/2014 | Williams | G01R 19/0092 324/76.11 |
| 8,847,564 B2 | * | 9/2014 | Williams | H02M 3/1582 323/223 |
| 2015/0061611 A1 | * | 3/2015 | Li | H02M 3/1588 323/235 |

FOREIGN PATENT DOCUMENTS

| | | |
|---|---|---|
| TW | 201125270 A1 | 7/2011 |
| TW | 201249080 A1 | 12/2012 |

* cited by examiner

*Primary Examiner* — Rajnikant Patel
(74) *Attorney, Agent, or Firm* — Li & Cai Intellectual Property (USA) Office

(57) ABSTRACT

The present disclosure provides a pair of NMOSFET switches connected in series, an output filter, a control circuit, a boot-strap capacitor and a disabling circuit. A high-side MOSFET switch is coupled to an input voltage. A low-side MOSFET switch is coupled to a ground. The high-side MOSFET switch and the low-side MOSFET switch have complementary duty cycles. The output filter is coupled to the NMOSFET switches to provide an output voltage. The boot-strap capacitor is coupled to the source of the high-side MOSFET switch. The voltage crossing the boot-trap capacitor is for making the gate voltage of the high-side MOSFET switch to be higher than the input voltage. The disabling circuit senses the voltage crossing the boot-strap capacitor, and generates a control signal to control the control circuit for continuously turning off the high-side MOSFET switch when the voltage crossing the boot-strap capacitor is less than a threshold voltage.

9 Claims, 7 Drawing Sheets

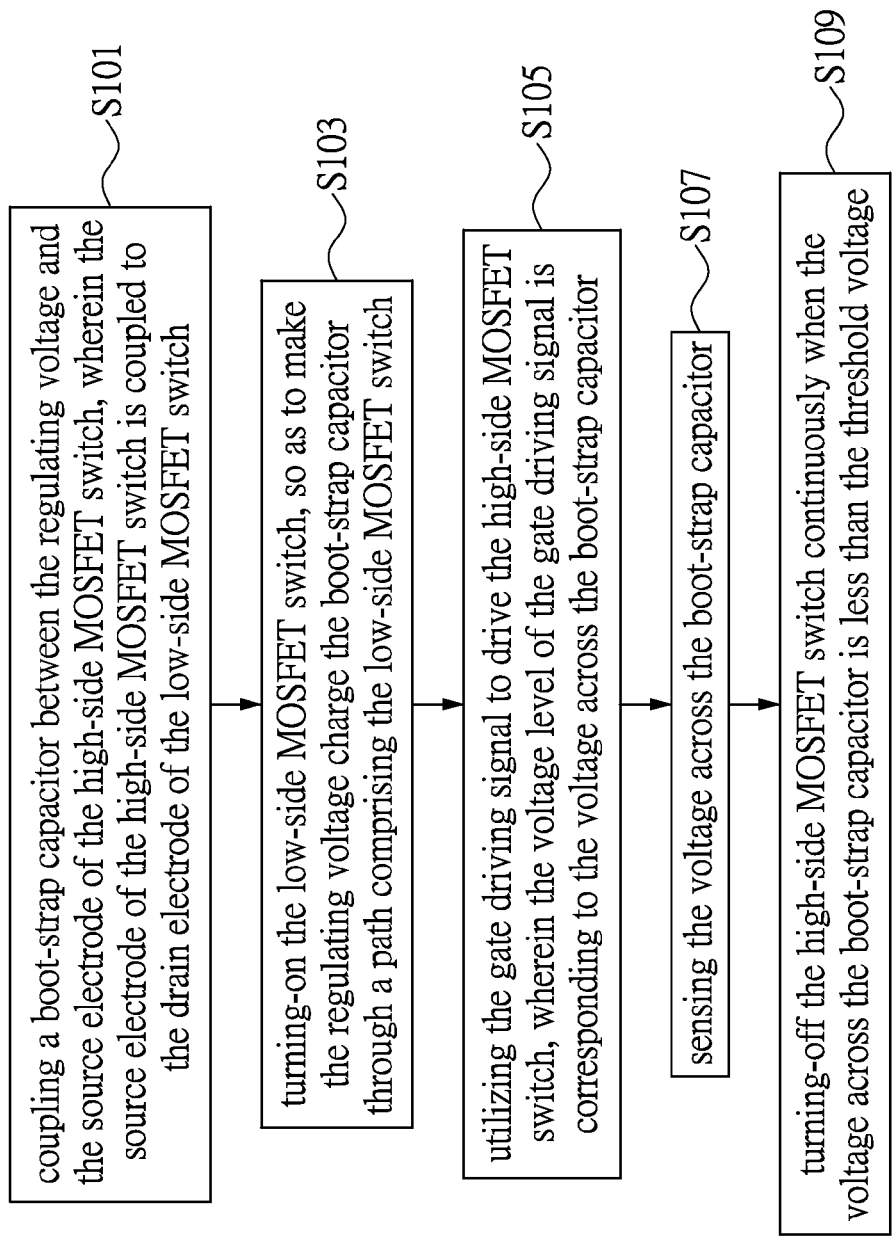

BUCK CONVERTER AND CONTROL METHOD THEREFOR

BACKGROUND OF THE INVENTION

1. Field of the Invention

The instant disclosure relates to a buck converter; in particular, to a buck converter and control method therefor.

2. Description of Related Art

Please refer to FIG. 1 in conjunction with FIG. 2A and FIG. 2B, FIG. 1 shows a circuit diagram of a conventional buck converter. The conventional buck converter 1 comprises a high-side N-type MOSFET 11, an inductor L, a capacitor C, a low-side N-type MOSFET 12, a control circuit 13, a boot-strap capacitor Cboot and a charge controller 14. An inductor L and a capacitor C of the buck converter 1 constitute an output filter for providing an output voltage VOUT. The control circuit 13 comprises a gate driving circuit 131, a feedback comparator 132 and a feedback circuit constituted of resistors R1, R2 (which dividing the output voltage VOUT to generate a feedback signal FB. The gate driving circuit 131 comprises a gate driving logic 1311, a buffer 1312 and a buffer 1313. The feedback comparator 132 compares the feedback FB and the reference voltage VREF. In the buck converter 1, the gate of the high-side N-type MOSFET switch 11 is turned-on or turned-off by the voltage of the boot-strap capacitor Cboot, wherein the voltage of the boot-strap capacitor is charged by the input voltage VIN through the charge controller 14 when the low-side N-type MOSFET 12 is turned-on. When the buck converter is in a light load operation, the low-side N-type MOSFET would not be turned-on most of the time. Ideally, the voltages of a first terminal BST and a second terminal SW of the boot-strap capacitor Cboot are shown in FIG. 2A. However, in practical, the voltage level of the boot-strap capacitor Cboot would decrease gradually due to leakage current, as shown in FIG. 2B. Therefore, when the output voltage VOUT is not enough, the voltage of the gate driving signal (varying with the voltage of the capacitor Cboot) controlling the high-side N-type MOSFET would be not high enough. Then the resistance of the high-side N-type MOSFET becomes large, and the high-side N-type MOSFET may be damaged due to large power dissipation leading to burnout of circuit.

Please refer to FIG. 1 in conjunction with FIG. 2C, FIG. 2C shows a curve diagram of the voltages at two terminals of a boot-strap capacitor of a conventional buck converter while the boot-strap capacitor being charged when the voltages across the two terminals of the boot-trap capacitor are less than a threshold voltage. U.S. Pat. No. 5,627,460 illustrates a technique avoiding the in-sufficient gate driving voltage of the high-side N-type MOSFET due to low voltage of the boot-strap capacitor Cboot. This technical solution turns on the low-side N-type MOSFET when the BST terminal voltage is below Vt, thus keeps the Cboot being re-charged frequently, as shown in FIG. 2C. However, it may cause efficiency reduction of the buck converter.

SUMMARY OF THE INVENTION

The object of the instant disclosure is to provide a buck converter and control method therefor in order to avoid damaging the high-side N-type MOSFET of the buck converter during operation.

In order to achieve the aforementioned objects, according to an embodiment of the instant disclosure, a buck converter is provided. The buck converter steps-down an input voltage to an output voltage. The buck converter comprises a high-side N-type MOSFET switch, a low-side N-type MOSFET switch, an output filter, a control circuit, a boot-strap capacitor and a disabling circuit. The drain electrode of the high-side N-type MOSFET switch is coupled to the input voltage. The drain electrode of the low-side N-type MOSFET switch is coupled to the source electrode of the high-side N-type MOSFET switch. The source electrode of the low-side N-type MOSFET switch is coupled to a ground. The high-side N-type MOSFET switch and the low-side N-type MOSFET switch have complementary duty cycles. The output filter is coupled to the source electrode of the high-side N-type MOSFET switch and the drain electrode of the low-side N-type MOSFET switch for providing the output voltage. The control circuit controls the high-side N-type MOSFET switch and the low-side N-type MOSFET switch. A first terminal of the boot-strap capacitor is coupled to a regulating voltage. A second terminal of the boot-strap capacitor is coupled to the source electrode of the high-side N-type MOSFET switch. The boot-strap capacitor is charged by the regulating voltage. The voltage of the first terminal of the boot-strap capacitor is provided to the control circuit for generating a gate driving signal controlling the high-side N-type MOSFET switch, wherein the voltage of the gate driving signal is higher than the input voltage. The disabling circuit is coupled to the boot-strap capacitor and the control circuit. The disabling circuit senses the voltage across the boot-strap capacitor, and generates a control signal to control the control circuit for continuously turning off the high-side N-type MOSFET switch when the voltage crossing the boot-strap capacitor is less than a threshold voltage.

In order to achieve the aforementioned objects, according to an embodiment of the instant disclosure, a control method for a buck converter is provided. The buck converter comprises the high-side N-type MOSFET switch coupling to an input voltage and a low-side N-type MOSFET switch coupling to a ground, the control method comprising coupling a boot-strap capacitor between a regulating voltage and the source electrode of the high-side N-type MOSFET switch, wherein the source electrode of the high-side N-type MOSFET switch is coupled to the drain electrode of the low-side N-type MOSFET switch; turning-on the low-side N-type MOSFET switch, so as to make the regulating voltage charge the boot-strap capacitor through a path comprising the low-side N-type MOSFET switch; utilizing a gate driving signal to drive the high-side N-type MOSFET switch, wherein the voltage level of the gate driving signal is corresponding to the voltage across the boot-strap capacitor; sensing the voltage across the boot-strap capacitor; and turning-off the high-side N-type MOSFET switch continuously when the voltage across the boot-strap capacitor is less than a threshold voltage.

In summary, a buck converter and control method therefor are provided to avoid the high-side N-type MOSFET switch being turned on when the voltage across the boot-strap capacitor is less than a threshold voltage. Accordingly, dangerous situation of damage (e.g. burning) of the high-side N-type MOSFET due to in-sufficient voltage of gate driving signal may be avoided.

In order to further the understanding regarding the instant disclosure, the following embodiments are provided along with illustrations to facilitate the disclosure of the instant disclosure.

BRIEF DESCRIPTION OF THE DRAWINGS

FIG. 7 shows a flow chart of a control method for a buck converter according to an embodiment of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of a Buck Converter]

Figure 1:
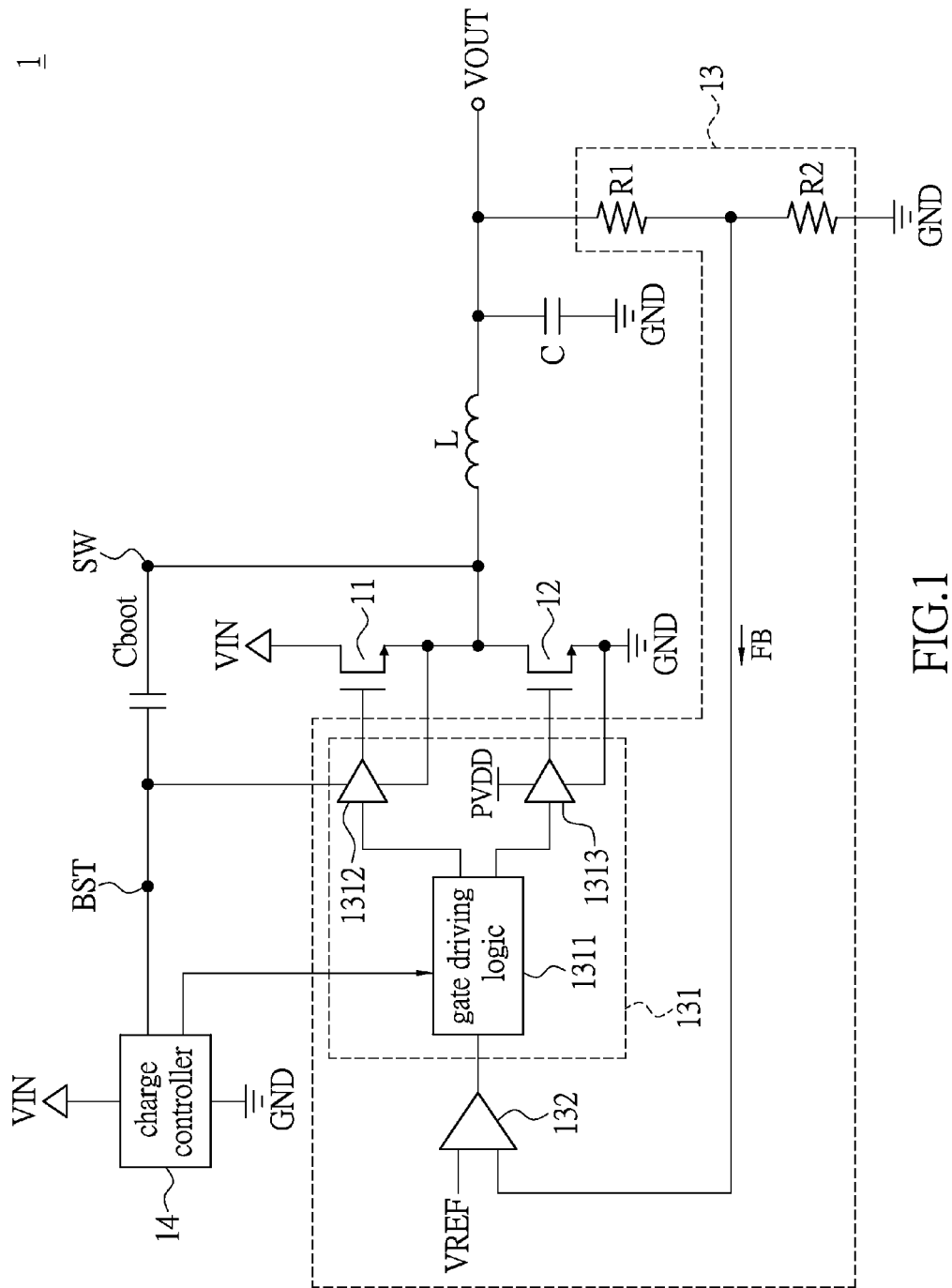
FIG. 1 shows a circuit diagram of a conventional buck converter.
Figure 2A:
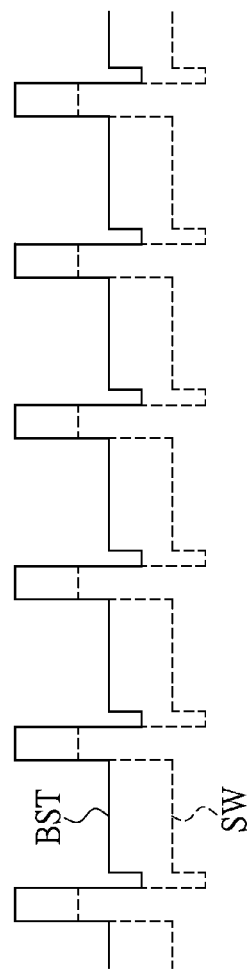
FIG. 2A shows a curve diagram of the voltages at two terminals of a boot-strap capacitor of a conventional buck converter in the ideal case.
Figure 2B:
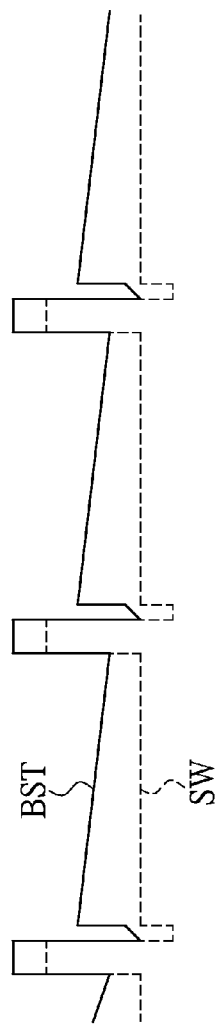
FIG. 2B shows a curve diagram of the voltages at two terminals of a boot-strap capacitor of a conventional buck converter in the real case.
Figure 2C:
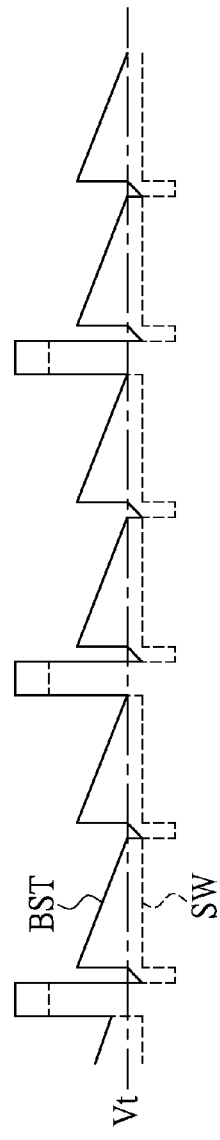
FIG. 2C shows a curve diagram of the voltages at two terminals of a boot-strap capacitor of a conventional buck converter while the boot-strap capacitor being charged when the voltages at two terminals of the boot-trap capacitor are less than a threshold voltage.
Figure 3:
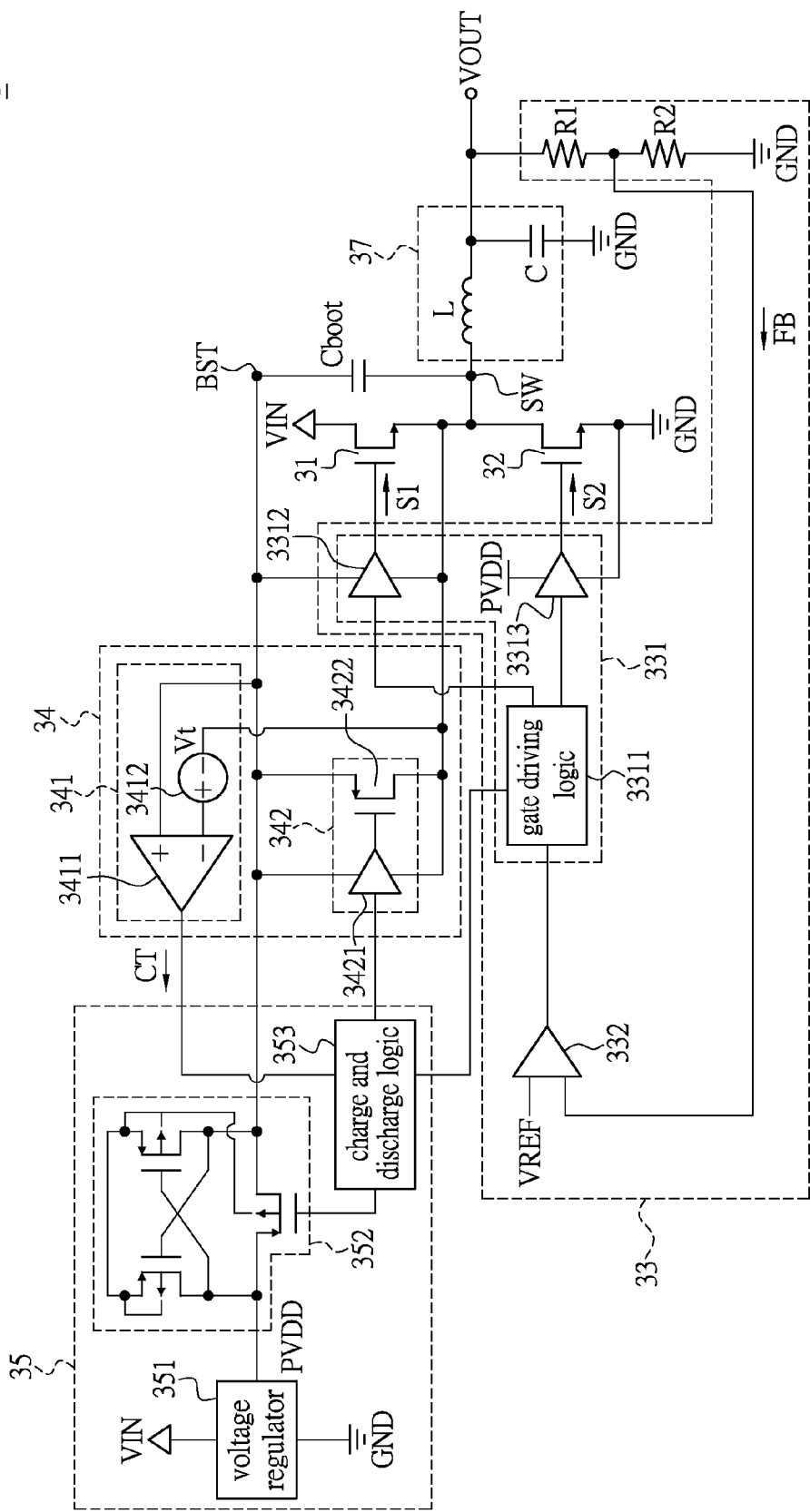
FIG. 3 shows a circuit diagram of a buck converter according to a an embodiment of the instant disclosure.

Please refer to FIG. 3 showing a circuit diagram of a buck converter according to an embodiment of the instant disclosure. The buck converter 3 steps-down an input voltage VIN to an output voltage VOUT. The buck converter 3 comprises a high-side N-type MOSFET switch 31, a low-side N-type MOSFET switch 32, an output filter 37, a control circuit 33, a boot-strap capacitor Cboot, a disabling circuit 34 and a charge and discharge controller 35.

The high-side N-type MOSFET switch 31, the low-side N-type MOSFET switch 32, and the output filter 37 constitute the typical buck converter. The output filter 37 comprises an inductor L and a capacitor C. A first terminal of the inductor L is coupled to the source of the high-side N-type MOSFET switch 31 and the drain of the low-side N-type MOSFET switch 32. A second terminal of the inductor L provides the output voltage VOUT. A first terminal of the capacitor C is coupled to the second terminal of the inductor L, and a second terminal of the capacitor C is coupled to a ground GND.

The drain electrode of the high-side N-type MOSFET switch 31 is coupled to the input voltage VIN. The drain electrode of the low-side N-type MOSFET switch 32 is coupled to the source electrode of the high-side N-type MOSFET switch 31. The source electrode of the low-side N-type MOSFET switch 32 is coupled to the ground GND. The high-side N-type MOSFET switch 31 and the low-side N-type MOSFET switch 32 have complementary duty cycles. The output filter 37 is coupled to the source electrode of the high-side N-type MOSFET switch 31 and the drain electrode of the low-side N-type MOSFET switch 32 for providing the output voltage VOUT. The control circuit 33 controls the high-side N-type MOSFET switch 31 and the low-side N-type MOSFET switch 32 to be turned-on or turned-off. A first terminal BST of the boot-strap capacitor Cboot is coupled to a regulating voltage PVDD of the charge and discharge controller 35. A second terminal SW of the boot-strap capacitor Cboot is coupled to the source electrode of the high-side N-type MOSFET switch 31 (and the drain electrode of the low-side N-type MOSFET switch 32). The boot-strap capacitor Cboot is charged by the regulating voltage PVDD through a boot-strap switch 352 when the low-side N-type MOSFET 32 is turned-on. The voltage of the first terminal BST of the boot-strap capacitor Cboot is provided to the buffer 3312 for generating a gate driving signal S1 controlling the high-side N-type MOSFET switch 31, wherein the voltage of the gate driving signal S1 is higher than the input voltage VIN. The disabling circuit 34 is coupled to the boot-strap capacitor Cboot and the control circuit 33. The disabling circuit 34 senses the voltage across the boot-strap capacitor Cboot (i.e. voltage difference between the first terminal BST and the second terminal SW), and generates a control signal CT to control the control circuit 33 for continuously turning off the high-side N-type MOSFET switch 31 when the voltage crossing the boot-strap capacitor Cboot is less than a threshold voltage Vt.

Specifically, as shown in FIG. 3, the control circuit 33 comprises a gate driving circuit 331, a feedback comparator 332 and a feedback circuit constituted of the resistors R1, R2. The feedback circuit generates a feedback voltage FB according to the output voltage VOUT. The feedback comparator 332 is coupled to the feedback circuit, and compares the feedback voltage FB and a reference voltage VREF for generating a comparing signal. The gate driving circuit 331 is coupled to the feedback comparator 332 and the gate electrode of the high-side N-type MOSFET switch 31 and the gate electrode of the low-side N-type MOSFET switch 32, and controls the high-side N-type MOSFET switch 31 and the low-side N-type MOSFET switch 32 according to the comparing signal for maintaining the output voltage VOUT to a stable voltage.

In this embodiment, the gate driving circuit 331 comprises a gate driving logic 3311, a buffer 3312 and a buffer 3313. The gate driving logic 3311 generates a control signal controlling (e.g. turn-on or turn-off) the high-side N-type MOSFET switch 31, and the buffer 3312 generates the gate driving signal S1 according to the mentioned control signal for controlling the high-side N-type MOSFET switch 31. For example, the buffer 3312 (or the buffer 3313) turns on the high-side N-type MOSFET switch 31 (or the low-side N-type MOSFET switch 32) when the gate driving logic 3311 generates a HIGH voltage level signal. The buffer 3312 (or the buffer 3313) turns off the high-side N-type MOSFET switch 31 (or the low-side N-type MOSFET switch 32) when the gate driving logic 3311 generates a LOW voltage level signal.

The buffer 3312 and the buffer 3313 are driving stages for providing sufficient variation range of the gate driving voltage. The variation range of the operation voltage of the buffer 3312 is between the voltage level of the first terminal BST of the boot-strap capacitor Cboot and the voltage level of the second terminal SW of the boot-strap capacitor Cboot, thus the gate driving signal S1 outputted by the butter 3312 may be higher than the input voltage VIN. The variation range of the operation voltage of the buffer 3313 is between the voltage level of the regulating voltage PVDD and the voltage level of the ground GND. The gate driving logic 331 generates a control signal controlling (e.g. turn-on or turn-off) the low-side N-type MOSFET switch 32, and the buffer 3313 generates the gate driving signal S2 according to the mentioned control signal for controlling the low-side N-type MOSFET switch 32. However, the control circuit 33 is not restricted thereto.

The charge and discharge controller 35 comprises a voltage regulator 351, a boot-strap switch 352 and a charge and discharge logic 353. The voltage regulator 351 converts the input voltage VIN to be a regulating voltage PVDD utilized for charging the boot-strap capacitor Cboot. In order to make the boot-strap capacitor Cboot have a proper voltage (which is the voltage difference between the first terminal BST and the second terminal SW) and avoid the voltage of the first terminal BST of the boot-strap capacitor Cboot feeding back to the regulating voltage PVDD (when the boot-strap switch 352 is turned off and the high-side N-type MOSFET switch 31 is turned on), the boot-strap switch 352 is utilized to control whether the boot-strap capacitor Cboot is charged.

Those skilled in the art will appreciate how to implement the boot-strap switch 352, and modifications and alternations of the boot-strap switch 352 would be readily observed. For example, the boot-strap switch could be replaced by a diode or other kinds of transistor, and there is no need to go into details. The charge and discharge logic 353 controls the boot-strap switch 352 to charge the boot-strap capacitor Cboot. In this embodiment, the charge and discharge logic 353 also receives the control signal CT from the disabling circuit 34 in order to discharge the boot-strap capacitor Cboot, but this instant disclosure is not so restricted. The charge and discharge logic 353 may be divided into a charge logic and a discharge logic, wherein the charge logic may be a part of the charge and discharge controller 35 (only responsible for charging the boot-strap capacitor Cboot) and the discharge logic may be a part of the disabling circuit 34 (only responsible for discharging the boot-strap capacitor Cboot). However, the high-side N-type MOSFET switch 31 and the low-side N-type MOSFET switch 32 are switched according to the output voltage VOUT, thus it needs an integrated control mechanism for the charging and discharging of the boot-strap capacitor Cboot. Therefore, in this embodiment, the charge and discharge logic 353 is utilized to control the boot-strap switch 352 and the disabling circuit 34.

The disabling circuit 34 comprises a determining unit 341 and a discharge unit 342. The determining unit 341 is coupled to the boot-strap capacitor Cboot, and determines whether the voltage across the boot-strap capacitor Cboot is less than the threshold voltage Vt, and generates the control signal CT accordingly. The discharge unit 342 is coupled to the boot-strap capacitor Cboot and the determining unit 341, wherein the discharge unit 342 discharges the boot-strap capacitor Cboot to make the voltage across the boot-strap capacitor Cboot be zero (i.e. the voltage difference between the first terminal BST and the second terminal SW is zero volt) according to the control signal CT when the voltage across the boot-strap capacitor Cboot is less than the threshold voltage Vt. Meanwhile, the operation voltage of the buffer 3312 of the control circuit 33 is about to zero volt (in which the maximum of the driving voltage S1 is the voltage of the second terminal SW of the boot-strap capacitor), thus the high-side N-type MOSFET switch 31 would not be turned on. Accordingly, the buck converter 3 of this embodiment could avoid possible damage of the high-side N-type MOSFET switch 31 due to large resistance when the high-side N-type MOSFET switch 31 is not well conducted.

Specifically, the determining unit 341 comprises a comparator 3411 and a voltage source 3412. A positive input terminal (+) of the comparator 3411 receives the voltage of the first terminal BST of the boot-strap capacitor Cboot. A negative input terminal (−) of the comparator 3411 receives the threshold voltage Vt. The mentioned threshold voltage Vt may be a predetermined voltage larger than zero volt, and the circuit designer may adjust the threshold voltage Vt arbitrarily as needed. The voltage source 3412 is coupled between the second terminal SW of the boot-strap capacitor Cboot and the negative input terminal (−) of the comparator 3411. The comparator 3411 compares the voltage across the boot-strap capacitor Cboot with the threshold voltage Vt for generating the control signal CT.

The discharge unit 342 comprises a discharge switch 3422 and a discharge control circuit 3421. In this embodiment, the discharge control circuit 3421 is a buffer, and the discharge control circuit is a P-type MOSFET. The discharge switch 3422 is coupled to the first terminal BST and the second terminal SW of the boot-strap capacitor Cboot. The discharge control circuit 3421 is coupled to a control terminal (which is a gate electrode of the P-type MOSFET) of the discharge switch 3422. The discharge control circuit 3421 controls the discharge switch 3422 to discharge the boot-strap capacitor Cboot according to the control signal CT. Specifically, the discharge control circuit 3421 is controlled by the control signal CT receiving through the charge and discharge logic 353. The discharge control circuit 3421 controls whether the discharge switch 3422 is turned on or turned off. When the voltage across the boot-strap capacitor Cboot is less than the threshold voltage Vt, the control signal CT generated by the comparator 3411 controls the discharge control circuit 3421 to turn on the discharge switch 3422 in order to discharge the boot-strap capacitor Cboot. It is worth mentioning that the determining unit 341 in this embodiment is only one example to embody the determining unit, and the instant disclosure is not restricted thereto. An artisan of ordinary skill in the art will appreciate how to implement the determining unit as long as the determining unit could determine whether the voltage across the boot-strap capacitor Cboot is less than the threshold voltage Vt.

Figure 4:
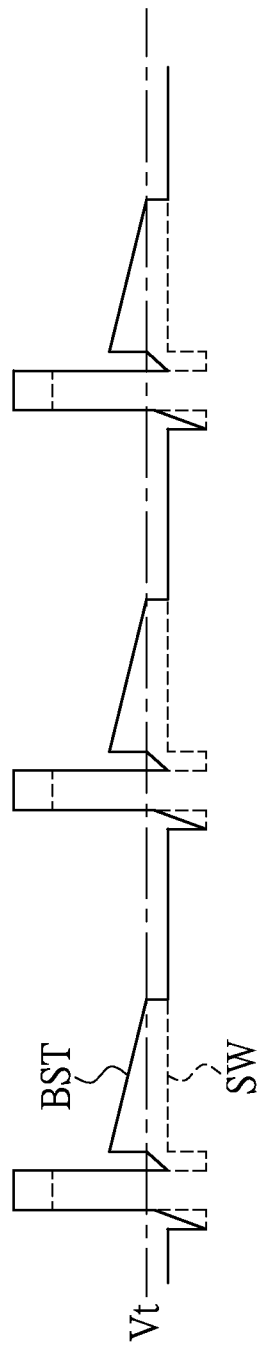
FIG. 4 shows a curve diagram of the voltages at two terminals of the boot-strap capacitor of the buck converter of FIG. 3.

Please refer to FIG. 3 in conjunction with FIG. 4, FIG. 4 shows a curve diagram of the voltages at two terminals of the boot-strap capacitor of the buck converter of FIG. 3. The voltage difference between the first terminal BST and the second terminal SW of the boot-strap capacitor Cboot is the voltage across the boot-strap capacitor. During "OFF" duty, the high-side N-type MOSFET switch 31 is turned off, and the low-side N-type MOSFET switch 32 is turned on, thus the boot-strap capacitor Cboot is charged. During "ON" duty, the high-side N-type MOSFET switch 31 is turned on, and the low-side N-type MOSFET is turned off. When the voltage of the first terminal BST is less than the threshold voltage Vt, the voltage difference between the first terminal BST and the second terminal SW of the boot-strap capacitor Cboot becomes zero volt according the operation of the disabling circuit 34 disclosed in FIG. 3. Therefore, the high-side N-type MOSFET could not be turned on in the next "ON" duty, then in the next "OFF" duty the low-side N-type MOSFET switch 32 is turned on and the boot-strap Cboot could be charged again. Accordingly, the circuit operation thereafter returns to normal (i.e. the high-side N-type MOSFET switch 31 could be turned on in "ON" duty).

[Another Embodiment of a Buck Converter]

Figure 5:
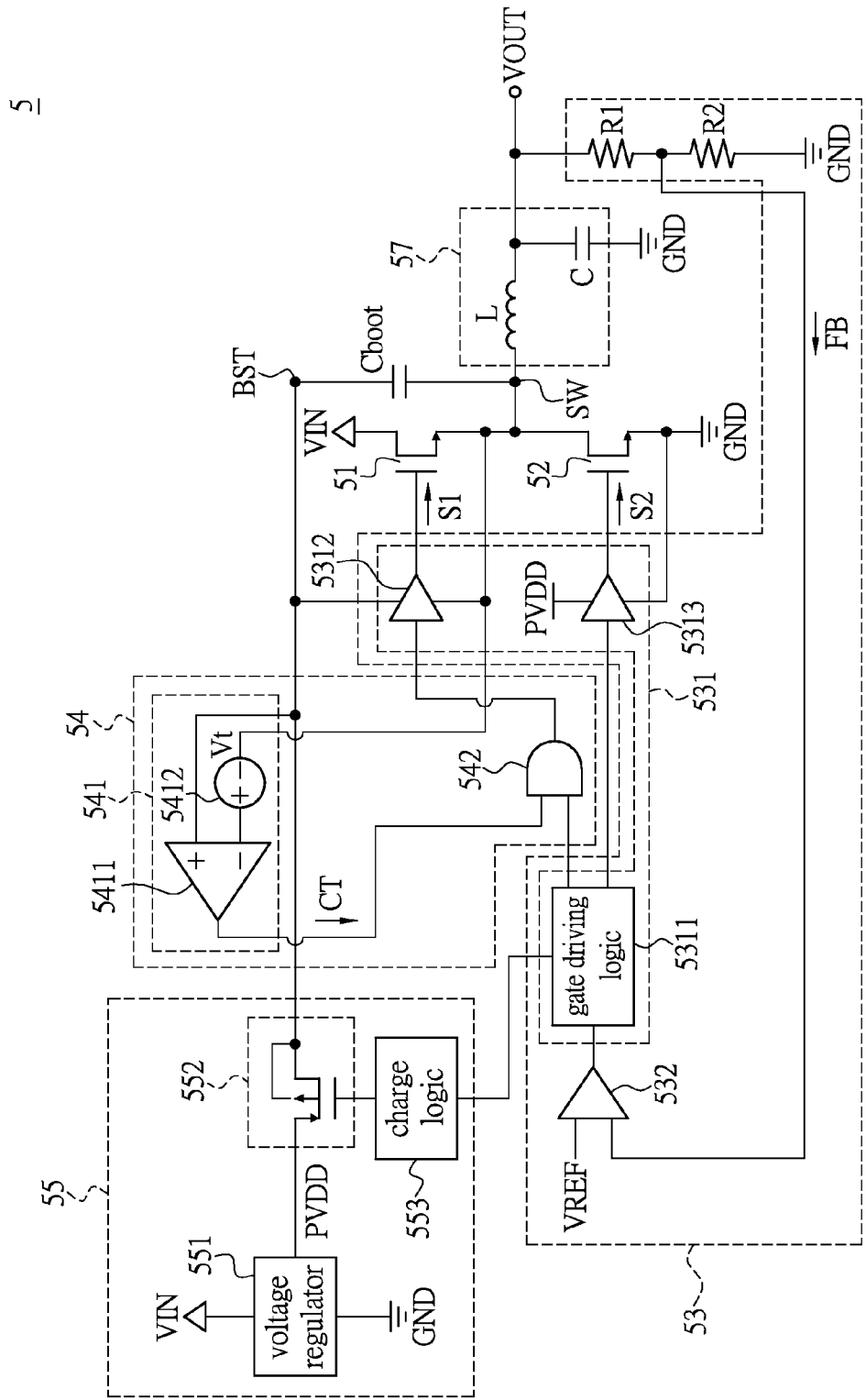
FIG. 5 shows a circuit diagram of a buck converter according to another embodiment of the instant disclosure.

Please refer to FIG. 5 showing a circuit diagram of a buck converter according to another embodiment of the instant disclosure. The buck converter 5 steps-down an input voltage VIN to an output voltage VOUT. The buck converter 5 comprises a high-side N-type MOSFET switch 51, a low-side N-type MOSFET switch 52, an output filter 57, a control circuit 53, a boot-strap capacitor Cboot, a disabling circuit 54 and a charge controller 55.

The control circuit 53 comprises a gate driving circuit 531, a feedback comparator 532 and a feedback circuit constituted of the resistors R1, R2. The gate driving logic 531 comprises a gate driving logic 5311, a buffer 5312 and a buffer 5313. The control circuit 53 is significantly identical to the control circuit 33 shown in FIG. 3 except for differences specified in the follows. The output of the gate driving logic 5311 for controlling the high-side N-type MOSFET switch 51 is transmitted to the disabling circuit 54 but not to the buffer 5312.

The charge controller 55 comprises a voltage regulator 551, a boot-strap switch 552, and a charge logic 553. The voltage regulator 551 converts the input voltage VIN to be a regulating voltage PVDD utilized for charging the boot-strap capacitor Cboot. The boot-strap switch 552 is utilized to control whether the boot-strap capacitor Cboot is charged. The charge logic 553 controls the boot-strap switch 552 to charge the boot-strap capacitor Cboot.

The buck converter 5 is significantly identical to the buck converter 3 shown in FIG. 3 except for differences between the disabling circuit 54 and the disabling circuit 34 of FIG. 3. The disabling circuit 54 comprises a determining unit 541 and a logic control unit 542. The determining unit 541 is coupled to the boot-strap capacitor Cboot, and determines whether the voltage across the boot-strap capacitor Cboot is less than a threshold voltage Vt, and generates the control signal CT accordingly. The determining unit 541 comprises a comparator 5411 and a voltage source 5412. The determining unit 541 is identical to the determining unit 341 of FIG. 3, thus the redundant information is not repeated. In this embodiment, the logic control unit 542 in the disabling circuit 54 replaces the discharge unit 342 of the disabling circuit 34. Therefore, the control signal CT generated by the determining unit 541 is transmitted to the logic control unit 542. The logic control unit 542 is coupled to the determining unit 541. The logic control unit 542 may be a logic AND gate (as shown in FIG. 5), and the logic AND gate receives the control signal CT from the disabling circuit 54 and the logic control signal from the gate driving logic 5311. The logic control unit 542 controls the buffer 5312 to disable the high-side N-type MOSFET switch 51 according to the control signal CT when the voltage across the boot-strap capacitor Cboot is less than the threshold voltage Vt. For example, when the voltage across the boot-strap capacitor Cboot is less than the threshold voltage Vt, the control signal CT outputted by the comparator 5411 is at a LOW voltage level, then the logic control unit 542 continuously outputs a LOW voltage level signal, thus the buffer 5312 could not turn on the high-side N-type MOSFET switch 51. Otherwise, when the voltage across the boot-strap capacitor Cboot is larger than the threshold voltage Vt, the control signal CT outputted by the comparator 5411 is at a HIGH voltage level, then if the gate driving logic 5311 provides a signal with a HIGH voltage level to the logic control unit 542 the buffer 5312 could turn on the high-side N-type MOSFET switch 51. In other words, the logic control unit 542 of the disabling circuit 54 controls whether the high-side N-type MOSFET switch 51 could be turned on according to the control signal CT.

It is worth mentioning that the disabling circuit 54 in this embodiment is only one example to control the high-side N-type MOSFET switch 51, and the instant disclosure is not restricted thereto. An artisan of ordinary skill in the art will appreciate how to implement the disabling circuit as long as the disabling circuit could disable the high-side N-type MOSFET switch 51 according to the control signal CT.

Figure 6:
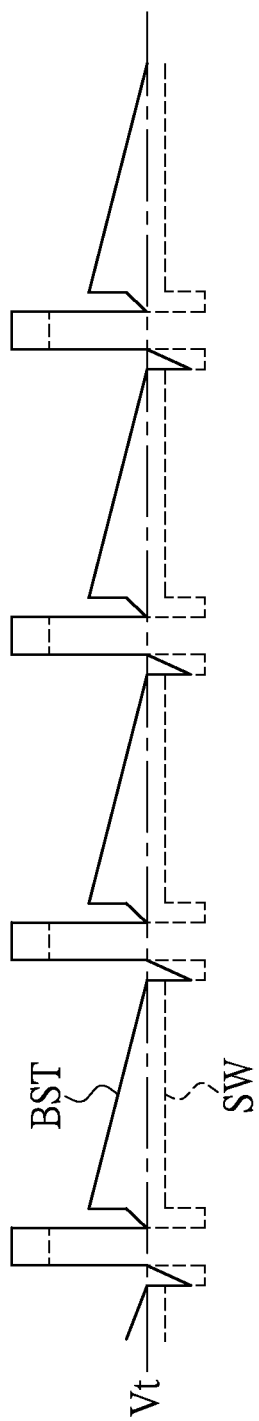
FIG. 6 shows a curve diagram of the voltages at two terminals of the boot-strap capacitor of the buck converter of FIG. 5.

Please refer to FIG. 6 in conjunction with FIG. 5, FIG. 6 shows a curve diagram of the voltages at two terminals of the boot-strap capacitor of the buck converter of FIG. 5. In normal operation, the high-side N-type MOSFET switch 51 is turned off and the low-side N-type MOSFET switch 52 is turned on during "OFF" duty, thus the boot-strap capacitor Cboot could be charged. During "ON" duty, the high-side N-type MOSFET switch 51 is turned on and the low-side N-type MOSFET switch 52 is turned off. According to the operation of the disabling circuit 54 shown in FIG. 5, the high-side N-type MOSFET switch 51 could not be turned on (i.e. continuously turned off) when the voltage of the first terminal BST is less than the threshold voltage Vt. Therefore, the high-side N-type MOSFET switch 51 could not be turned on in the next "ON" duty, in which the voltages of the first terminal BST and the second terminal SW are not changed during the next "ON" duty. Then, in the next "OFF" duty, the low-side N-type MOSFET switch 52 is turned on for charging the boot-strap capacitor Cboot again, and the follow-up circuit operation returns to normal (i.e. the high-side N-type MOSFET switch 51 could be turned on during the "ON" duty thereafter).

[An Embodiment of a Control Method for a Buck Converter]

Please refer to FIG. 7 showing a flow chart of a control method for a buck converter according to an embodiment of the instant disclosure. The control method is utilized for controlling the high-side N-type MOSFET switch 31 of the buck converter 3 shown in FIG. 3 or the high-side N-type MOSFET switch 51 of the buck converter 5 shown in FIG. 5. The buck converter 3 (or 5) comprises the high-side N-type MOSFET switch 31 (or 51) coupling to an input voltage VIN and a low-side N-type MOSFET switch 32 (or 52) coupling to a ground GND. The control method comprises following steps. Firstly, in step S101, coupling a boot-strap capacitor Cboot between a regulating voltage PVDD and the source electrode of the high-side N-type MOSFET switch 31 (or 51), wherein the source electrode of the high-side N-type MOSFET switch 31 (or 51) is coupled to the drain electrode of the low-side N-type MOSFET switch 32 (or 52). Then, in step S103, turning-on the low-side N-type MOSFET switch 32 (or 52), so as to make the regulating voltage PVDD charge the boot-strap capacitor Cboot through a path comprising the low-side N-type MOSFET switch 32 (or 52). Then, in step S105, utilizing a gate driving signal S1 to drive the high-side N-type MOSFET switch 31 (or 51), wherein the voltage level of the gate driving signal S1 is corresponding to the voltage across the boot-strap capacitor Cboot. Then, in step S107, sensing the voltage across the boot-strap capacitor Cboot.

Then, in step S109, turning-off the high-side N-type MOSFET switch 31 (or 51) continuously when the voltage across the boot-strap capacitor Cboot is less than the threshold voltage Vt. In step S109, the operation of the circuit shown in FIG. 3 could discharge the boot-strap capacitor Cboot, so as to make the voltage across the boot-strap capacitor Cboot be zero volt. Alternatively, the operation of circuit shown in FIG. 5 could disable the high-side N-type MOSFET switch (51).

According to above descriptions, a buck converter and control method therefor are provided to avoid the high-side N-type MOSFET switch being turned on when the voltage across the boot-strap capacitor is less than a threshold voltage. Accordingly, dangerous situation of damage (e.g. burning) of the high-side N-type MOSFET due to in-sufficient voltage of gate driving signal may be avoided. Further, in order to turn off the high-side N-type MOSFET switch continuously, the boot-strap capacitor is discharged or the high-side N-type MOSFET switch is disabled, thus the power dissipation could be saved and the efficiency could be improved.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A buck converter, stepping-down an input voltage to an output voltage, comprising:
   a high-side N-type MOSFET switch, the drain electrode of the high-side N-type MOSFET switch coupled to the input voltage;
   a low-side N-type MOSFET switch, the drain electrode of the low-side N-type MOSFET switch coupled to the source electrode of the high-side N-type MOSFET switch, the source electrode of the low-side N-type MOSFET switch coupled to a ground, wherein the high-side N-type MOSFET switch and the low-side N-type MOSFET switch have complementary duty cycles;
   an output filter, coupled to the source electrode of the high-side N-type MOSFET switch and the drain electrode of the low-side N-type MOSFET switch, providing the output voltage;
   a control circuit, controlling the high-side N-type MOSFET switch and the low-side N-type MOSFET switch;
   a boot-strap capacitor, a first terminal of the boot-strap capacitor coupled to a regulating voltage, a second terminal of the boot-strap capacitor coupled to the source electrode of the high-side N-type MOSFET switch, the boot-strap capacitor being charged by the regulating voltage, the voltage of the first terminal of the boot-strap capacitor being provided to the control circuit for generating a gate driving signal controlling the high-side N-type MOSFET switch, wherein the voltage of the gate driving signal is larger than the input voltage; and
   a disabling circuit, coupling to the boot-strap capacitor and the control circuit, the disabling circuit sensing the voltage across the boot-strap capacitor, and generating a control signal to control the control circuit for continuously turning off the high-side N-type MOSFET switch when the voltage crossing the boot-strap capacitor is less than a threshold voltage, and comprising:
      a determining unit, coupled to the boot-strap capacitor, determining whether the voltage across the boot-strap capacitor is less than the threshold voltage and generating the control signal accordingly; and
      a discharge unit, coupled to the boot-strap capacitor and the determining unit, wherein the discharge unit discharges the boot-strap capacitor to make the voltage across the boot-strap capacitor be zero according to the control signal when the voltage across the boot-strap capacitor is less than the threshold voltage.

2. The buck converter according to claim 1, wherein the determining unit comprises:
   a comparator, comparing the voltage across the boot-strap capacitor with the threshold voltage for generating the control signal.

3. The buck converter according to claim 1, wherein the discharge unit comprises:
   a discharge switch, coupled to a first terminal and a second terminal of the boot-strap capacitor; and
   a discharge control circuit, coupled to a control terminal of the discharge switch, controlling the discharge switch to discharge the boot-strap capacitor according to the control signal.

4. The buck converter according to claim 1, wherein the disabling circuit comprises:
   a determining unit, coupled to the boot-strap capacitor, determining whether the voltage across the boot-strap capacitor is less than the threshold voltage and generating the control signal accordingly; and
   a logic control unit, coupled to the determining unit, wherein the logic control unit controls the control circuit to disable the high-side N-type MOSFET switch when the voltage across the boot-strap capacitor is less than the threshold voltage.

5. The buck converter according to claim 4, wherein the determining comprises:
   a comparator, comparing the voltage across the boot-strap capacitor with the threshold voltage for generating the control signal.

6. The buck converter according to claim 1, wherein the control circuit comprises:
   a feedback circuit, receiving the output voltage, generating a feedback voltage according to the output voltage;
   a feedback comparator, coupled to the feedback circuit, comparing the feedback voltage and a reference voltage for generating a comparing signal; and
   a gate driving circuit, coupled to the feedback comparator, the gate electrode of the high-side N-type MOSFET switch and the gate electrode of the low-side N-type MOSFET switch, controlling the high-side N-type MOSFET switch and the low-side N-type MOSFET switch according to the comparing signal.

7. The buck converter according to claim 1, wherein the output filter comprises:
   an inductor, a first terminal of the inductor coupled to the source electrode of the high-side N-type MOSFET switch and the drain electrode of the low-side N-type MOSFET switch, a second terminal of the inductor providing the output voltage; and
   a capacitor, a first terminal of the capacitor coupled to the second terminal of the inductor, a second terminal of the capacitor coupled to the ground.

8. A control method for a buck converter, for controlling a high-side N-type MOSFET switch of the buck converter, the buck converter comprising the high-side N-type MOSFET switch coupling to an input voltage and a low-side N-type MOSFET switch coupling to a ground, the control method comprising:
   coupling a boot-strap capacitor between a regulating voltage and the source electrode of the high-side N-type MOSFET switch, wherein the source electrode of the high-side N-type MOSFET switch is coupled to the drain electrode of the low-side N-type MOSFET switch;
   turning-on the low-side N-type MOSFET switch, so as to make the regulating voltage charge the boot-strap capacitor through a path comprising the low-side N-type MOSFET switch;
   utilizing a gate driving signal to drive the high-side N-type MOSFET switch, wherein the voltage level of the gate driving signal is corresponding to the voltage across the boot-strap capacitor;
   sensing the voltage across the boot-strap capacitor; and
   turning-off the high-side N-type MOSFET switch continuously and discharging the boot-strap capacitor for making the voltage across the boot-strap capacitor be zero, when the voltage across the boot-strap capacitor is less than a threshold voltage.

9. The control method according to claim 8, wherein the step of turning-off the high-side N-type MOSFET switch continuously when the voltage across the boot-strap capacitor is less than a threshold voltage further comprises disabling the high-side N-type MOSFET switch.

* * * * *